METHOD OF FORMING ELECTRICAL CONDUCTORS
Filed July 2, 1970 2 Sheets-Sheet 1
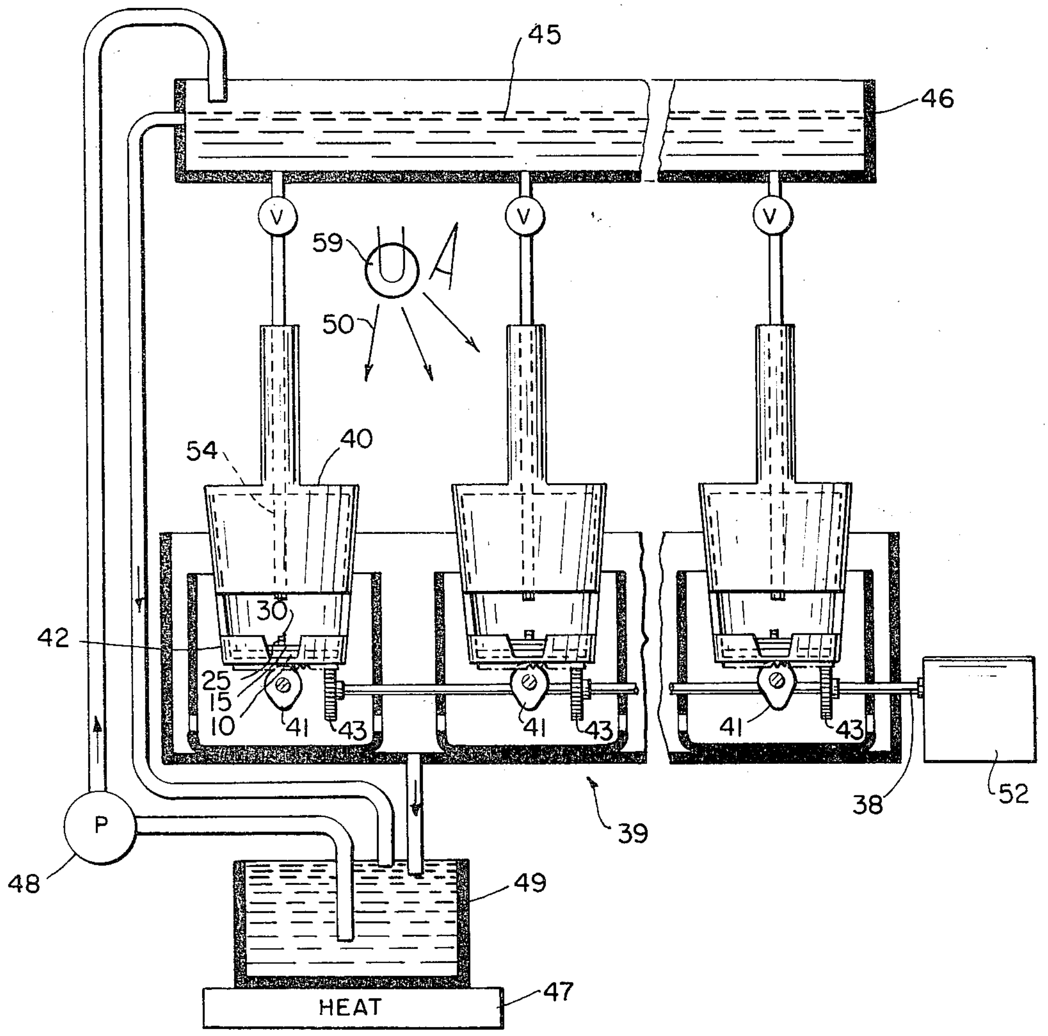
FIG. I
INVENTORS
RICHARD M. CLINEHENS
JOHN K. STEWART JR. &
ROBERT W. DITMER
BY Louis A. Kline
John J. Callahan
John P. Sarlano
THEIR ATTORNEYS

METHOD OF FORMING ELECTRICAL CONDUCTORS

Filed July 2, 1970 2 Sheets-Sheet 2

INVENTORS
RICHARD M. CLINEHENS
JOHN K. STEWART JR. &
ROBERT W. DITMER

BY Louis A. Kline
John J. Callahan
John P. Tarlano

THEIR ATTORNEYS

United States Patent Office 3,674,579
Patented July 4, 1972

3,674,579
METHOD OF FORMING ELECTRICAL CONDUCTORS

Richard M. Clinehens, Dayton, John K. Stewart, Jr., Kettering, and Robert W. Ditmer, Englewood, Ohio, assignors to The National Cash Register Company, Dayton, Ohio Filed July 2, 1970, Ser. No. 51,808
Int. Cl. C23f *1/00*
U.S. Cl. 156—5 4 Claims

ABSTRACT OF THE DISCLOSURE

The present invention relates to a method of forming electrical conductors to selected regions of a semiconductor wafer. An aluminum film of approximately 10,000 angstroms is evaporated upon a silicon dioxide insulative evaporation mask which has been formed on a silicon wafer. A conductor mask is formed upon selected areas of the aluminum film. The masked aluminum film is placed upon a spinner. Phosphoric acid is continuously poured near the center of the masked metal film. The masked aluminum film is spun for a period of approximately four minutes, to remove the portions of the aluminum film which are not coated by the conductor mask, in order to form electrical conductors in contact with selected regions of the silicon wafer.

BACKGROUND OF THE INVENTION

Francis E. Clark, in United States Pat. No. 2,827,723, issued Mar. 25, 1958, disclosed a method of etching the surface of a masked work piece. The unmasked portions of the surface of the masked work piece are etched by spinning the work piece and simultaneously depositing an acid upon the work piece. Clark does not, however, show the selective sectioning of a masked aluminum film, to form electrical conductors under a conductor mask on the aluminum film. Clark does not show the formation of electrical conductors in contact with selected regions of a semiconductor wafer.

The present application shows how to rapidly section a masked aluminum film, to form uniform electrical conductors below a conductor mask. The present applicants spin a masked metal film during its sectioning, to form uniform electrical conductors therefrom.

The method of the present invention can be used to form the uniform conductors of a monolithic integrated circuit. Such conductors at present are made from a selectively masked metal film which is sectioned by being dipped in acid. The dipping method does not remove gas bubbles from the surface of the metal film during its sectioning. The retarded chemical reaction around said gas bubbles causes slow sectioning. The overall sectioning of the metal film is therefore slow. Uneven chemical reaction causes the sectioning time to be quite long. Nonuniform conductors are produced due to the extended period needed for electrical conductor formation.

Conductor failure is reduced, due to the improved method of the present invention, which allows for more rapid formation of electrical conductors.

SUMMARY OF THE INVENTION

A method of forming electrical conductors to selected regions of a semiconductor wafer, comprising evaporating a metal film both onto and through an insulative evaporation mask on the semiconductor wafer, to the surface of the semiconductor wafer; providing a conductor mask selectively upon said metal film, the conductor mask selectively covering areas to the metal film which are not to be removed; applying a stream of acid for the metal film, near the center of the metal film, to begin the sectioning of the metal film; spinning the selectively masked metal film at a speed sufficient to remove gas bubbles formed due to the attack of the metal film by the stream of acid, to increase the sectioning rate of the metal film; and stopping the spinning of the selectively masked metal film after the reflectance of the metal film decreases, so as to form thin metal conductors to selected regions of the silicon wafer, out of the selectively masked metal film, which metal conductors are uniformly wide as a result of the increased rate of sectioning of the metal film.

An object of the present invention is to provide an improved method of forming uniform electrical conductors from a metal film.

Another object of the present invention is to produce more uniform electrical conductors through an insulative evaporation mask to a semiconductor wafer beneath an insulative evaporation mask.

A further object of the present invention is to provide a method for decreasing the probability of electrical conductor failure.

DESCRIPTION OF THE DRAWINGS

FIG. 1 is a plan view of the formation of conductors through an insulative evaporation mask to a silicon wafer by the method of the present invention.

DESCRIPTION OF THE PREFERRED EMBODIMENT

Figures 2, 3, 4:
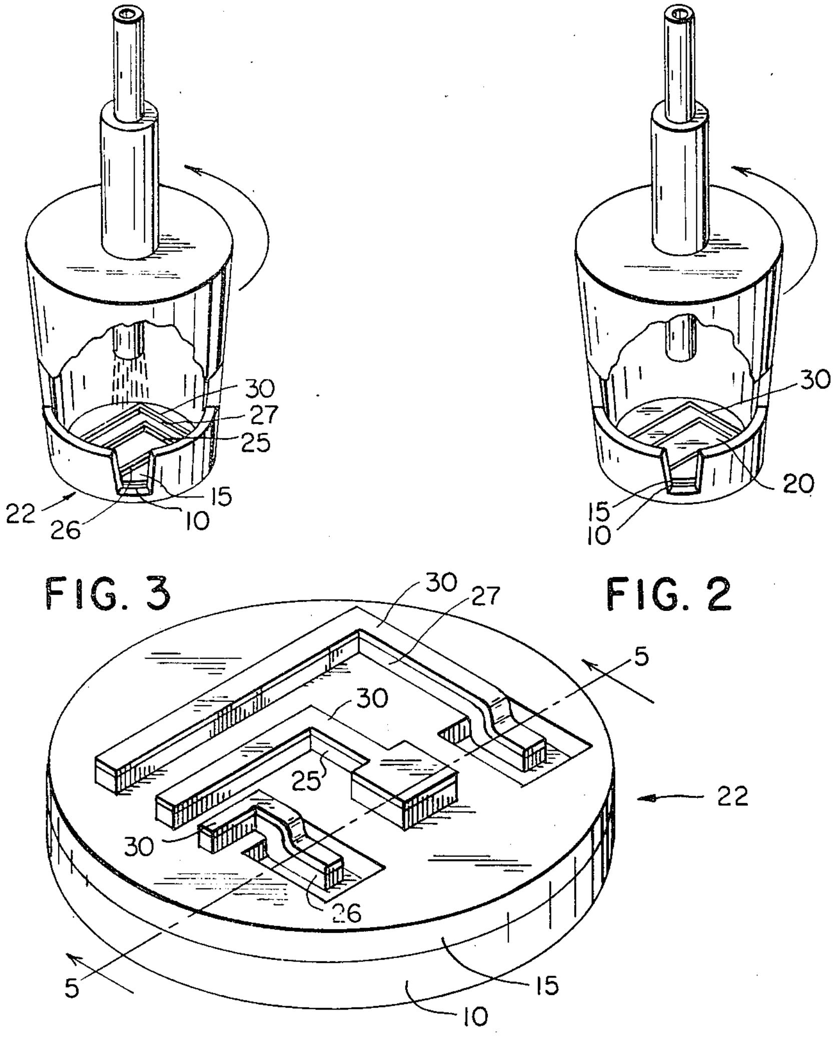
FIG. 2 is a perspective view of the formation of uniform conductors through an insulative evaporation mask to a silicon wafer.
FIG. 3 is a perspective view of uniform conductors which have been formed as part of an integrated circuit in a silicon wafer.
FIG. 4 is a perspective view of uniform conductors of an MOS transistor which has been formed in a silicon wafer.

As shown in FIGS. 1 and 4, a semiconductor wafer 10, such as an N-type silicon wafer, has a thin silicon dioxide insulator layer formed thereon, by oxidation of the wafer 10. The silicon dioxide insulator layer is used to insulate the silicon wafer 10 from a conductor 25 formed thereon. Windows are selectively formed in the silicon dioxide insulator layer to allow contact between an aluminum film 20, which is to be evaporated thereon, and p-type regions 34 and 35 of the silicon wafer 10. The windows are opened through the silicon dioxide insulator layer to form an insulative evaporation mask 15. Conductors 26 and 27 are formed from the aluminum film 20, to electrically contact the p-type regions 34 and 35 in the silicon wafer 10, which p-type regions 34 and 35 are below the windows in the insulative evaporation mask 15. The conductor 25 is formed from the aluminum film so as to act as a gate electrode in insulative contact with the channel region between the p-type regions 34 and 35.

As shown in FIG. 2, an aluminum film 20 is evaporated upon the insulative evaporation mask 15, and through the windows of the evaporation mask 15 and in contact with the p-type regions 34 and 35. The aluminum film 20 is passed through the windows of the insulative evaporation mask 15 by vacuum evaporation of the aluminum film 20. The aluminum film 20 is approximately 10,000 angstroms thick, a desired film thickness from which the aluminum conductors 25, 26, and 27 can be formed..

As shown in FIG. 2, a 10,000-angstrom-thick photoresist conductor mask 30, which will protect certain selected areas of the aluminum film 20 from the attack of phosphoric acid, is formed on the aluminum film 20. To make the photoresist conductor mask 30, photoresist solution is uniformly deposited over the aluminum film 20. The portions of the photoresist conductor mask 30 which are to protect the aluminum film 20 from attack are not exposed to ultraviolet light. The portions of the photoresist conductor mask 30 which are to be removed from the aluminum film 20 are exposed to ultraviolet light for approximately ten seconds. The exposed portions of the photoresist conductor mask 30 are removed by a solvent, to form the photoresist conductor mask 30 upon the aluminum film 20.

FIGS. 1, 2 and 3 show apparatus 39 for sectioning the masked aluminum film 20. A toothed spinner 40 is driven by a gear 43 connected to a drive shaft 38 and a motor 52. The spinner 40 has a retaining ridge 42. The teeth of the spinner 40 may be disengaged by a cam 41 from the gear 43 to stop the rotation of the spinner 40. The spinner 40 is used to spin the aluminum film 20 during attack. The apparatus 39 will spin the spinner 40 at 2,000 revolutions per minute. This rate of revolution of the spinner 40 is sufficient to remove hydrogen bubbles from the aluminum film 20 during its selective attack.

Concentrated phosphoric acid 45 is provided in a reservoir 46, which is above the spinners 40. The phosphoric acid 45 is warmed to a temperature of approximately 60 degrees centigrade by a heater 47 below a reservoir 49. A pump 48 pumps the warmed phosphoric acid 45 from the reservoir 49 to the reservoir 46. The warm phosphoric acid 45 flows through a tube 54 at 100 cc./minute onto the center of the aluminum film 20 immediately below the tube 54, and spreads horizontally out therefrom. The spinner 40 rotates around the tube 54, which extends well into the spinner 40.

The aluminum film 20 is spun at 2,000 revolutions per minute, after the phosphoric acid 45 is flowing on the aluminum film 20. Rapid attack begins when the aluminum film 20 begins spinning. The phosphoric acid 45 is then swept over the surface of the aluminum film 20 to quickly attack it. Gas bubbles, which are formed as a result of the attack by the phosphoric acid 45, are swept away by the spinning, so as to increase the sectioning rate of the aluminum film 20. The spinning phosphoric acid 45 sweeps hydrogen gas bubbles away from the aluminum film 20 as it spreads to the edge of the spinning aluminum film 20, to increase the speed with which the aluminum film 20 is sectioned. The aluminum conductors 25, 26, and 27, which are formed, are more uniform conductors than could be formed without the spinning. The width and the thickness of the aluminum conductors 25, 26, and 27 are more uniform due to the spinning.

A light means 59 is provided at a thirty-degree angle in relation to the axis of rotation of the spinner 40 to allow observation of the aluminum film 20 while it is being spun. The amount of reflected light 50 from the spinning aluminum film 20 is used to determine when the aluminum conductors 25, 26, and 27 have been formed out of the aluminum film 20.

Hydrogen gas bubbles, which are formed due to the reaction of the phosphoric acid 45 with the unmasked portions of the aluminum film 20, are removed from the aluminum film 20 by the spinning action. These gas bubbles, if removed, would cause the sectioning rate to be about 6% of the sectioning rate attained during the spinning of the aluminum film 20.

The small hydrogen gas bubbles, when left on the aluminum film 20, greatly retard the attack of the aluminum film 20 by additional phosphoric acid 45 which comes into contact with the aluminum film 20. Spinning of the aluminum film 20 is used to increase the attack rate, and to thereby make electrically reliable conductors 25, 26, and 27 quickly.

The sectioning rate of the aluminum film 20 is greatly retarded by merely stopping the spinner apparatus 40, using the cam 41, due to the rapid formation of hydrogen gas bubbles after the spinning stops. This effect is used during the sectioning procedure to examine the progress in the formation of the conductors 25, 26, and 27 from the aluminum film 20. This interim procedure allows for better control in the formation of the aluminum conductors 25, 26, and 27 from the aluminum film 20.

When the spinner 40 is stopped, even though the phosphoric acid 45 continues to flow on the aluminum film 20, the sectioning rate is slowed down to about 6% of the sectioning rate achieved during the spinning. This retardation in sectioning rate is due to the fact that small hydrogen gas bubbles are formed on the aluminum film 20 to retard the sectioning rate of the aluminum film 20. These gas bubbles protect the surface of the aluminum film 20 from attack by the phosphoric acid 45.

A 2,000 r.p.m. speed of rotation is an optimum speed of rotation of the aluminum film 20. If the aluminum film 20 is rotated at too low a speed, hydrogen gas bubbles will not be removed from the aluminum film 20 as the phosphoric acid 45 spreads out. If the speed of rotation is too great, the rapidly-moving phosphoric acid 45, as it spreads out, will not completely cover the photoresist conductor mask 30 to cause complete sectioning. The phosphoric acid 45 will fly off the spinning wafer 10 in streaks.

A slow sectioning rate, which occurs when one does not spin the aluminum film 20, allows for photoresist conductor mask undercutting, due to the long period of time required for conductor formation. The time of conductor formation, with spinning of the aluminum film 20, is four minutes. The time of conductor formation without spinning of the aluminum film 20 is about one hour.

One observes the light 50 as it is reflected from the masked aluminum film 20 during the sectioning procedure. When one notices that there is a marked decrease in the amount of reflected light from the aluminum film 20 due to the break-up of the aluminum film 20 into conductors 25, 26, and 27, one stops the spinning of the silicon wafer 10. One then stops the flow of the phosphoric acid 45. One then rinses the formed aluminum conductors with water, to completely stop the attack by the phosphoric acid 45. The aluminum conductors 26 and 27 pass through the insulative evaporation mask 15 to make contact with the p-type regions 34 and 35 in the n-type silicon wafer 10.

The time required for the break-up of the aluminum film 20 into the aluminum conductors 25, 26, and 27 is approximately four minutes, when a 10,000-angstrom-thick aluminum film 20 is spun at 2,000 revolutions per minute. If the aluminum film 20 is not spun, the aluminum conductor formation takes about sixty minutes. The aluminum conductors 25, 26, and 27 are then quite nonuniform.

Figure 5:
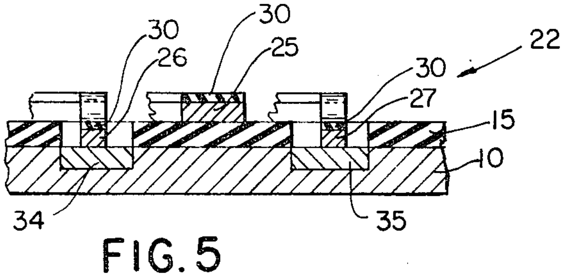
FIG. 5 is a sectional view of uniform conductors of an MOS transistor which has been formed in the silicon wafer of FIG. 4.

The gate electrode 25, the source electrode 26, and the drain electrode 27 are formed on the silicon wafer 10, as shown in FIG. 5. An MOS transistor, with source and drain electrodes 26 and 27 and gate electrode 25, is made by the method of the present invention, as shown in FIGS. 4 and 5.

The present invention is very useful in making the aluminum conductors of an integrated circuit on a silicon wafer. Conductors of an integrated circuit, when formed by the present method, are electrically very dependable.

What is claimed is:

1. A method of quickly forming electrical conductors to selected regions of a semiconductor wafer, comprising:

(a) evaporating a metal film both onto and through an insulative evaporation mask on the semiconductor wafer, to the surface of the semiconductor wafer;

(b) providing a conductor mask selectively upon said metal film, the conductor mask selectively covering areas of the metal film which are not to be removed;
(c) applying a stream of acid for the metal film on and normal to the center of the metal film to begin the sectioning of the metal film;
(d) simultaneously spinning the selectively masked metal film at a speed sufficient to allow the centrifugal force of said acid to remove gas bubbles, formed due to the attack of the metal film by the stream of acid, radially from said metal film to increase the sectioning rate of the metal film; and
(e) stopping the spinning of the selectively masked metal film after the reflectance of the metal film decreases, so as to form thin metal conductors to selected regions of the silicon wafer, out of the selectively masked metal film, which metal conductors are uniformly wide as a result of the increased rate of sectioning of the metal film.

2. The method of claim 1 wherein the metal film is an aluminum film and the acid is warm phosphoric acid.

3. The method of claim 1 wherein the insulative evapoartion mask is a silicon dioxide insulator layer.

4. The method of claim 1 wherein the metal film is an approximately 10,000-angstrom-thick aluminum film, the acid is warm phosphoric acid, the conductor mask is an approximately 10,000-angstrom-thick photoresist conductor mask, and the speed of spinning is approximately 2,000 revolutions per minute.

References Cited

UNITED STATES PATENTS

| | | | |
|---|---|---|---|
| 3,513,022 | 5/1970 | Casterline et al. | 156—17 X |
| 2,827,723 | 3/1958 | Clark | 134—109 X |
| 2,983,631 | 5/1961 | Hanlet | 117—200 |
| 3,079,254 | 2/1963 | Rowe | 96—36 |
| 3,408,733 | 11/1968 | Arnold et al. | 29—590 |
| 3,432,919 | 3/1969 | Rosvold | 29—578 |
| 3,437,533 | 4/1969 | Dingwall | 148—187 |
| 3,535,775 | 10/1970 | Garfinkel et al. | 156—17 X |

ROBERT F. BURNETT, Primary Examiner

R. O. LINKER, Jr., Assistant Examiner

U.S. Cl. X.R.

134—158; 156—8, 22